United States Patent
Truong et al.

(10) Patent No.: US 7,242,339 B1
(45) Date of Patent: Jul. 10, 2007

(54) PROGRAMMABLE REFERENCE VOLTAGE GENERATOR

(75) Inventors: Bao G. Truong, Austin, TX (US); Joel D. Ziegelbein, Iowa City, IA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/333,613

(22) Filed: Jan. 17, 2006

(51) Int. Cl.
*H03M 1/78* (2006.01)

(52) U.S. Cl. ................................ 341/154; 375/257

(58) Field of Classification Search .............. 341/154; 375/257, 244; 326/26, 29, 30; 365/226
See application file for complete search history.

(56) References Cited

U.S. PATENT DOCUMENTS

| | | | | |
|---|---|---|---|---|
| 5,042,307 A | | 8/1991 | Kato | .................. 73/708 |
| 5,331,599 A | * | 7/1994 | Yero | .................. 365/226 |
| 5,572,474 A | | 11/1996 | Sheen | .................. 365/207 |
| 5,864,584 A | * | 1/1999 | Cao et al. | .................. 375/244 |
| 5,994,925 A | | 11/1999 | Sessions | .................. 326/121 |
| 6,304,098 B1 | * | 10/2001 | Drost et al. | .................. 326/26 |
| 6,507,223 B2 | | 1/2003 | Felder | .................. 327/77 |
| 6,617,991 B2 | | 9/2003 | Kaul | .................. 341/155 |
| 7,058,131 B2 | * | 6/2006 | Dreps et al. | .................. 375/257 |
| 2003/0086501 A1 | * | 5/2003 | Dreps et al. | .................. 375/257 |

* cited by examiner

*Primary Examiner*—Jean Bruner Jeanglaude
(74) *Attorney, Agent, or Firm*—Winstead PC

(57) ABSTRACT

A reference generator circuit has a resistor string between the potentials of the power supply voltage that is partitioned into a top string, a middle string, and a bottom string. PFET devices are used to couple the positive power supply voltage a selected node of the top string in response to first control signals and complementary second control signals are used to control NFET devices that couple the ground power supply voltage to a selected node of the bottom string. If a resistor is effectively removed from the top string a corresponding resistor is effectively added in the bottom string keeping the total resistance in the resistor string substantially constant. A pass gate network is used to select between nodes of the middle string as a vernier for generating small step sizes.

20 Claims, 7 Drawing Sheets

PROGRAMMABLE REFERENCE VOLTAGE GENERATOR

TECHNICAL FIELD

The present invention relates in general to board level transmission line drivers and receivers, and in particular, to references for pseudo-differential drivers and receivers.

BACKGROUND INFORMATION

Digital computer systems have a history of continually increasing the speed of the processors used in the system. As computer systems have migrated towards multiprocessor systems, sharing information between processors and memory systems has also generated a requirement for increased speed for the off-chip communication networks. Designers usually have more control over on-chip communication paths than for off-chip communication paths. Off-chip communication paths are longer, have higher noise, impedance mismatches, and have more discontinuities than on-chip communication paths. Since off-chip communication paths are of lower impedance, they require more current and thus more power to drive.

When using inter-chip high-speed signaling, noise and coupling between signal lines (cross talk) affects signal quality. One way to alleviate the detrimental effects of noise and coupling is through the use of differential signaling. Differential signaling comprises sending a signal and its compliment to a differential receiver. In this manner, noise and coupling affect both the signal and the compliment equally. The differential receiver only senses the difference between the signal and its compliment as the noise and coupling represent common mode signals. Therefore, differential signaling is resistant to the effects that noise and cross talk have on signal quality. On the negative side, differential signaling increases pin count by a factor of two for each data line. The next best thing to differential signaling is pseudo-differential signaling. Pseudo-differential signaling comprises comparing a data signal to a reference voltage using a differential receiver or comparator.

When high speed data is transmitted between chips, the signal lines are characterized by their transmission line parameters. High speed signals are subject to reflections if the transmission lines are not terminated in an impedance that matches the transmission line characteristic impedance. Reflections may propagate back and forth between driver and receiver and reduce the margins when detecting signals at the receiver. Some form of termination is therefore usually required for all high-speed signals to control overshoot, undershoot, and increase signal quality. Typically, a Thevenin's resistance (equivalent resistance of the Thevenin's network equals characteristic impedance of transmission line) is used to terminate data lines allowing the use of higher valued resistors. Additionally, the Thevenin's network is used to establish a bias voltage between the power supply rails. In this configuration, the data signals will then swing around this Thevenin's equivalent bias voltage. When this method is used to terminate data signal lines, a reference voltage is necessary to bias a differential receiver that operates as a pseudo-differential receiver to detect data signals in the presence of noise and cross talk.

Integrated circuit (IC) power supply voltage levels have been decreasing to manage power dissipation as circuit density has increased. The low power supply levels require corresponding low level reference voltage levels for receives using a pseudo differential topology. To optimize signal quality, it is desirable to have the reference voltage level programmable which requires corresponding small voltage step sizes. To insure uniform resolution, it is also necessary for the step sizes to be linear. There is, therefore, a need for a circuit for generating a reference voltage for pseudo differential receivers that is programmable with linear, uniform small voltage steps.

SUMMARY OF THE INVENTION

The present invention generates a reference voltage for use in pseudo-differential signaling using a switched voltage divider string to set a coarse reference value and a pass transistor selection network to make a final fine voltage selection around the coarse value. The voltage divider string comprises a series connection of a number N resistors partitioned into a top string of P first resistors, a middle string of K second resistors and a bottom string of P first resistors such that N=2P+K. The top string has PFET devices that couple the positive power supply voltage to each of P+1 first nodes in the top string in response to a set of P+1 first control signals. The bottom string has NFET devices that couple the ground power supply voltage to each of P+1 nodes in the bottom string. The middle string has K−1 vernier nodes and thus K−1 pass transistors for selectively coupling a vernier node in the middle string to an output in response to K−1 third control signals thereby generating the programmable reference voltage. The first and second control signals are such that the total resistance between the power supply and thus the current loading of the resistor string remains constant during the selection process. This allows the reference voltage to be programmed generating small steps with good linearity. Since the reference voltage is based on resistance ratios, it is relatively independent of process variations and absolute values of the individual resistors.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
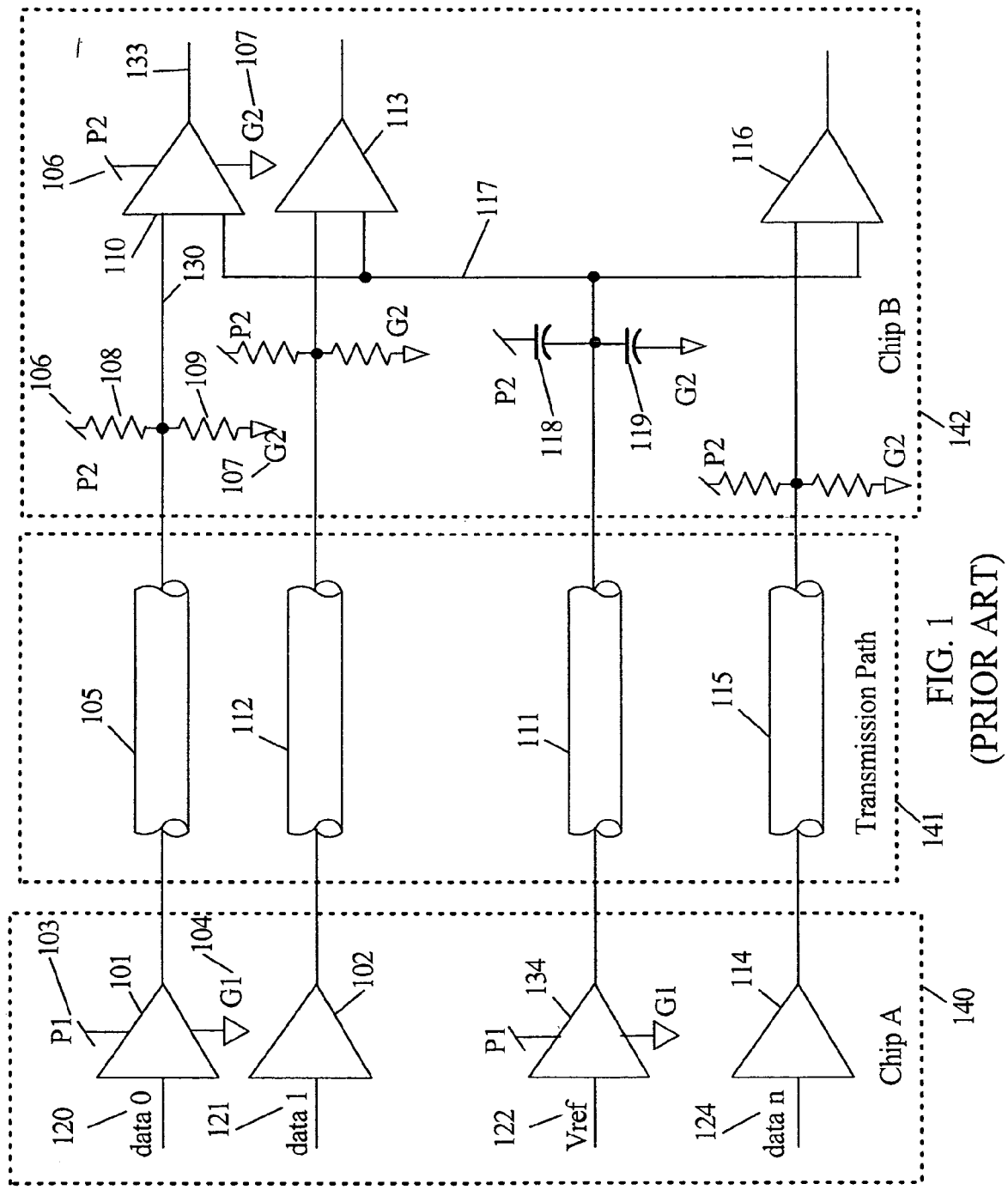
FIG. 1 is a circuit diagram of prior art pseudo-differential signaling with Thevenin's equivalent resistive divider termination.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 1 is a circuit diagram of typical pseudo-differential signaling for transmitting data from drivers in a Chip A 140 to receivers in a Chip B 142 via a transmission path 141. Drivers 101, 102 and 114 represent three of a number of n drivers sending data to receivers 110, 113 and 116, respectively. Exemplary driver 101 receives data 0 120 and generates an output that swings between power supply rail voltages P1 103 (logic one) and G1 104 (logic zero). When the output of driver 101 is at P1 103, any noise on the power bus is coupled to transmission line 105 along with the logic state of the data signal. Exemplary transmission line 105 is terminated with a voltage divider comprising resistors 108 and 109. Receiver input 130 has a DC bias value determined by the voltage division ratio of resistors 108 and 109 and the voltage between P2 106 and G2 107. Receiver 110 is powered by voltages P2 106 and G2 107 which may have different values from P1 103 and G1 104 due to distribution losses, noise coupling, and dynamic impedance of the distribution network. Exemplary receiver 110 is typically a voltage comparator or high gain amplifier that amplifies the difference between a signal at input 130 and a reference voltage at node 117. Voltage reference Vref 122 may be programmable and generated by a variety of techniques. Additionally, Vref 122 may be buffered with amplifier 134 and distributed via line 111 to the exemplary receivers 110, 113 and 116. While Vref 122 may be a stable reference, it may not track variations in power supply P1 103. Likewise, the noise on line 111 coupled to node 117 will likely be different than the noise coupled to a data line (e.g., 105). While capacitors 118 and 119 may reduce high frequency noise on node 117, variations in power supply voltage P2 106 are not tightly coupled to node 117. The variations in power supply voltages P1 103 and P2 106 are coupled to the data inputs (e.g., 130) differently than variations are coupled to node 117. Likewise, power supply noise is coupled to the data inputs differently and thus noise and power supply variations do not manifest themselves as common mode signals that may be reduced by the common mode rejection capabilities of the differential receivers (e.g., 110, 113, and 116). This reduces the effectiveness of pseudo-differential signaling.

Figure 2:
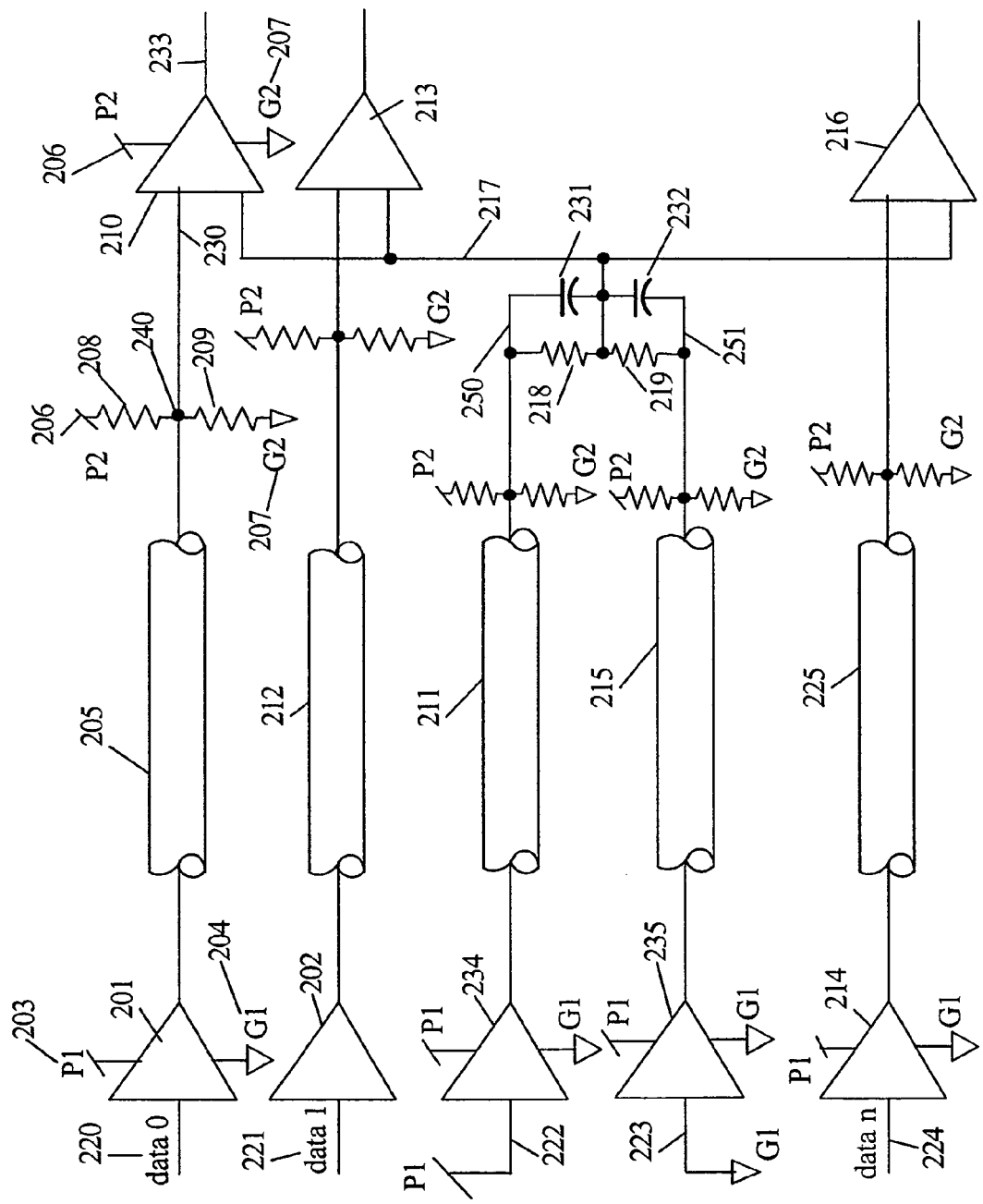
FIG. 2 is another circuit diagram of pseudo-differential signaling.

FIG. 2 is a circuit diagram of another prior art pseudo-differential signaling. Drivers 201, 202 and 214 transmit data signals data 0 220, data 1 221, and data n 224 to receivers 210, 213 and 216 via transmission lines 205, 212, and 225. Exemplary drivers 201, 202, and 214 are characterized as having driver outputs that switch between their power supply voltage potentials (e.g., P1 203 and G2 204) coupling these voltage potentials to the input of transmission lines 205, 212, and 225 with a source impedance. Transmission lines 205, 212, and 225 are terminated with resistive voltage dividers (e.g., resistors 208 and 209). The exemplary resistive voltage divider (termination network) comprising resistors 208 and 209 and power supply voltage potentials P2 206 and G2 207 form a Thevenin's voltage source at the node 240 coupled to input 230. This Thevenin's voltage source has a source impedance as the parallel combination of resistors 208 and 209 and a Thevenin's voltage generated from the power supply represented by the voltage between voltage potentials P2 206 and G2 207. Exemplary receivers 213 and 216 have similar termination networks to the termination network of receiver 210 comprising resistor 208 and 209 and the voltage potentials P2 206 and G2 207. The details of these termination networks are not shown for simplicity. It is understood that while the transmission lines (e.g., 205), receivers (e.g., receiver 210), and termination networks (e.g., resistors 208, 209, P2 206, and G2 207) are separable elements comprising inputs, nodes, etc. they may be shown in FIG. 2 as electrically connected where all the individual inputs, outputs, and nodes may not all have designators. For example, anyone of ordinary skill in the art would know that a transmission line (e.g., 205) has an transmission line input and a transmission line output even though a particular representation may have the transmission line input coupled to a driver output (e.g., output of driver 201) and the transmission line output coupled to a receiver input (e.g., 230) where only one of the connections has a designator.

Exemplary data input 230 is coupled to node 240 of the termination network and the output of transmission line 205 and tracks variations in power supply voltages P1 203–G1 204 and P2 206–G2 207. The receivers 210, 213 and 216 respond to the difference between their data inputs and the derived reference voltage at node 217 generated according to embodiments of the present invention. The reference voltage at node 217 is generated as the voltage division of the voltage difference on nodes 250 and 251. A driver 234 (equivalent to exemplary driver 201) has an input 222 coupled to a voltage (e.g., P1 203) that causes the output of driver 234 to transition to a voltage substantially equal to P1 203. The output of driver 234 transmits this voltage level to node 250 where it is terminated. Any noise or variations in P1 203 are also present on node 250 and are representative of variations and noise that would be present on exemplary data input 230 when it is at a logic one level. Another driver 235 (also equivalent to exemplary driver 201) has an input 223 coupled to a voltage (e.g., G1 204) that drives the output of driver 235 to a voltage substantially equal to G1 204. The output of driver 235 transmits this voltage level to node 251 where it is terminated. Any noise or variations in G1 204 are also present on node 251 and are representative of variations and noise that would be present on exemplary data input 230 when it is at a logic zero level. Nodes 250 and 251 also have noise coupled from P2 206 and G2 207 similar to noise that is coupled to exemplary data input 230. The voltage across nodes 250 and 251 is voltage divided to generate the derived reference voltage at node 217. Capacitors 231 and 232 low pass filter the derived reference voltage at node 217. The derived reference voltage at node 217 now has the same band limited noise and power supply voltage tracking as the data inputs (e.g., 230). The derived reference voltage at node 217 improves the margins for determining a logic one and logic zero and has much less variance than was achievable with the standard pseudo-differential signaling circuitry of FIG. 1.

Figure 3:
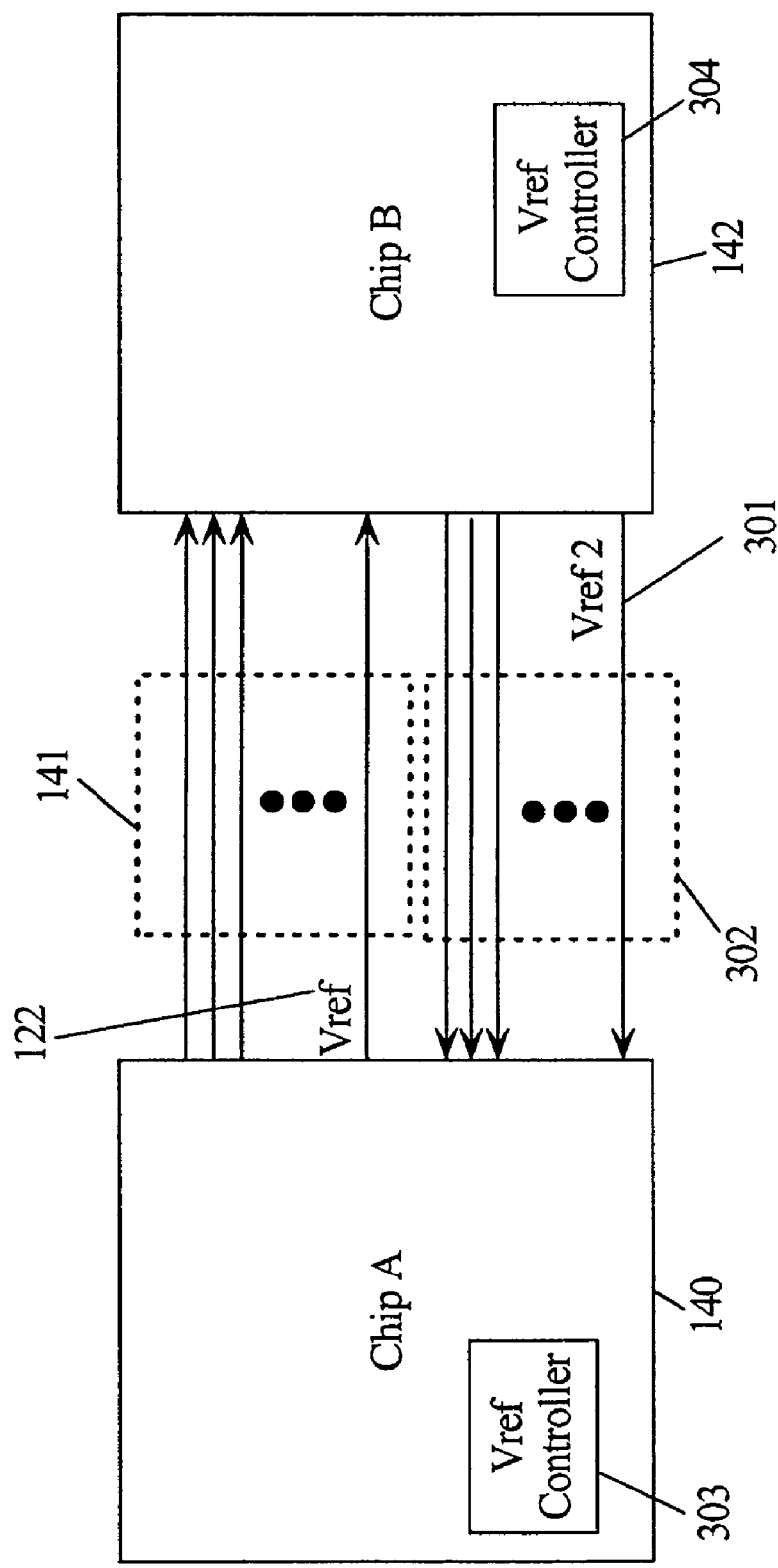
FIG. 3 is a data processing system suitable for practicing embodiments of the present invention.

FIG. 3 is a block diagram of communication between integrated circuit Chip A 140 and Chip B 142, wherein the transmission paths 141 and 302 may transmit signals from logic circuitry that is separated by a significant distance relative to their communication frequency such that pseudo-differential signaling is used to improve reliability. The reference voltage 122 is for signals in transmission path 141 from Chip A 140 to Chip B 142. The reference voltage 301 is for signals in transmission path 302 from Chip B 142 to Chip A 140 and is generated in Chip B 142. Reference voltages 122 and 301, in each of the two integrated circuit chips, may be used for the pseudo-differential signaling and may be generated using the programmable reference voltage generator 600 according to embodiments of the present invention. Vref controllers 303 and 304 may be used to generate control signals for programmable reference voltage generator 600 to vary the values of Vref 122 and Vref 302 to optimize signal quality.

Figure 4:
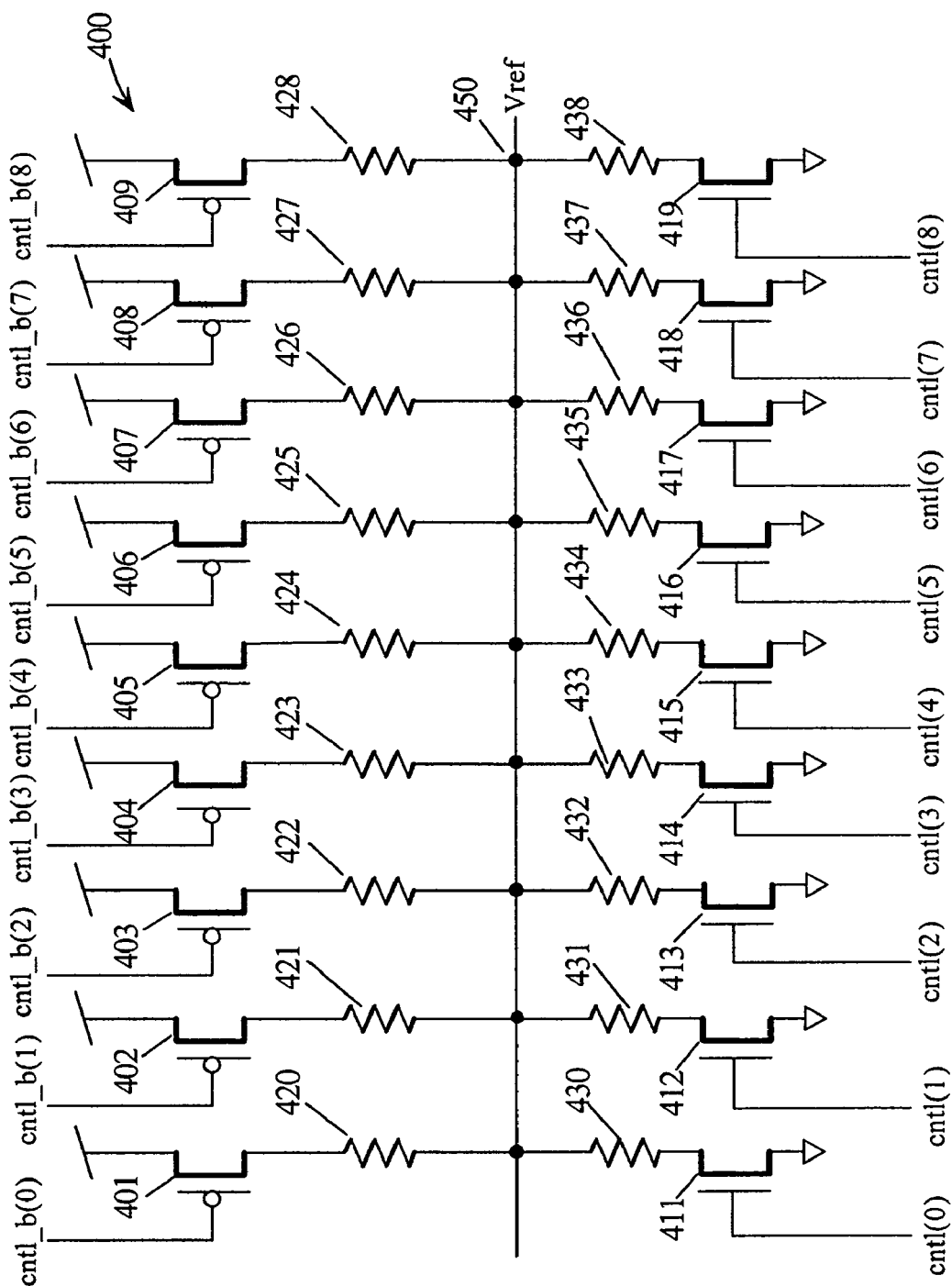
FIG. 4 is a circuit diagram of one method for generating a programmable reference voltage.

FIG. 4 is a circuit diagram of a reference generator 400 that provides a Vref 450 using a push/pull mechanism. Control signals Cntl_b (N) are used to determine how many of the PFETS 401–409 are gated ON and thus how many resistors are in parallel in the top half circuitry comprising PFETS 401–409 and resistors 420–428. The more resistors of resistors 420–428 that are in parallel relative to resistors 430–438 the higher the level of Vref 450. Control signals Cntl (N) are used to determine how many of the NFETS 411–419 are gated ON and thus how many resistors are in parallel in the bottom half circuitry comprising NFETS 411–419 and resistors 430–438. The more resistors 430–438 that are in parallel relative to resistors 420–428 the lower the level of Vref 450. The drawback of this circuitry is that it requires a large number of equal resistors to maintain linear step sizes if small voltage steps are desired. This leads to a large circuit area.

Figure 5:
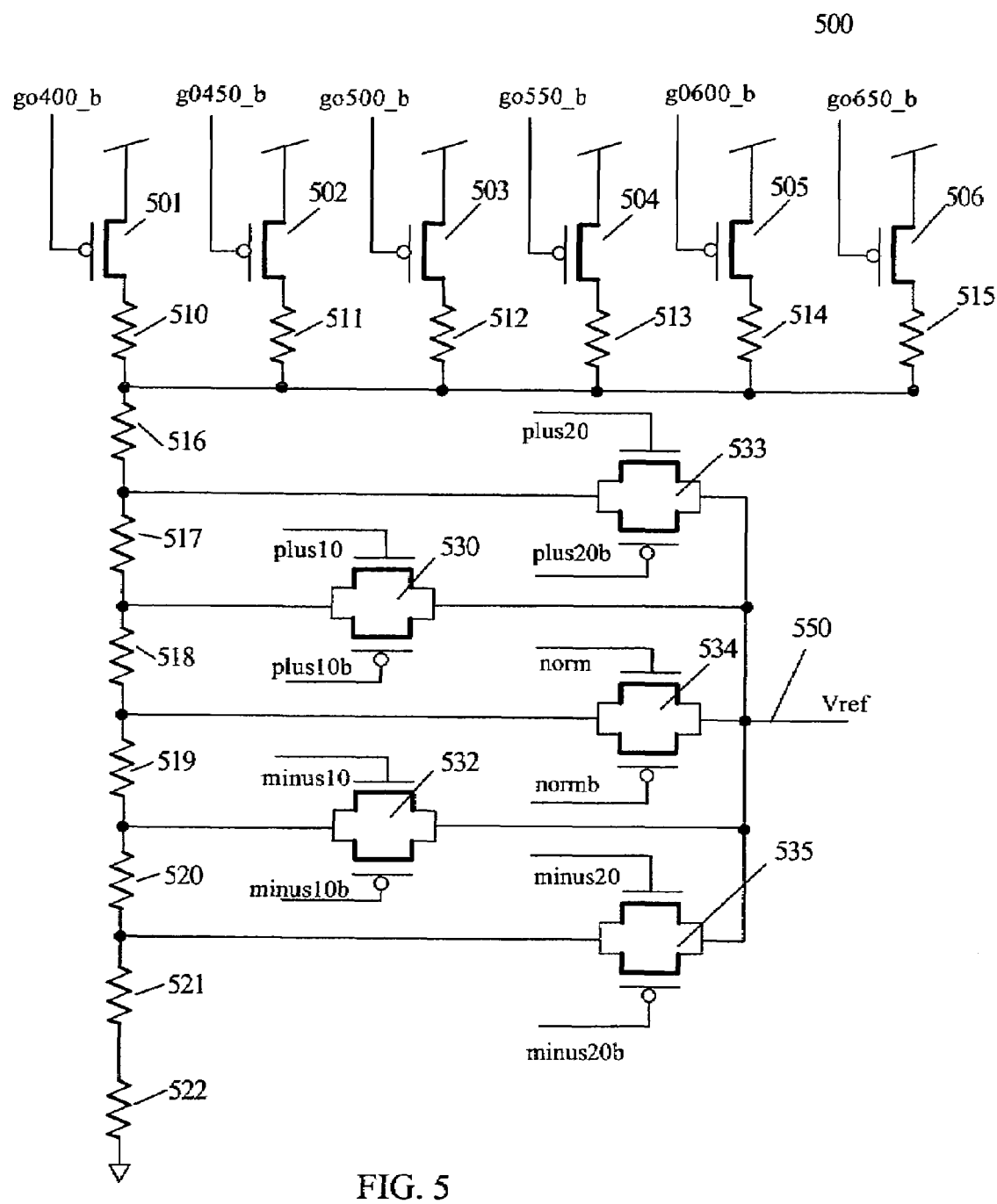
FIG. 5 is a circuit diagram of a reference generator according to an embodiment of the present invention.

FIG. 5 is a circuit 500 that allows Vref 550 to be generated with small step sizes without requiring too much space. PFET devices 501–506 are used to select the resistors 510–515 to couple the positive power supply voltage in a "one hot" configuration using control signals go400_b–go650_b. In a "one hot" configuration, only one of the PFET devices 501–506 is ON at any one time, thus only one of control signals go400_b–go650_b are a logic zero at any time. By making resistors 510–515 have progressively larger values, Vref 550 may be made to increase or decrease between a low value and a high value. Once coarse adjustments are made, then selecting which tap of resistor string 516–520 is coupled as Vref 550 provides for a fine vernier adjustment using pass gates 530–535 and control signals (norm, normb), (plus10, plus10b), (plus20, plus20b), (minus10, minus10b) and (minus20, minus 20b) which are complementary pairs that have a logic "one hot" configuration. This method has a fundamental limitation when considering linear step sizes. Resistors 510–515 are individually selected and have a resistance of the same order as the resistance of 519–522. Thus, the current from the power supply varies depending on what resistor 510–515 is selected. Since the resistors 516–522 are fixed, the voltage drop across this string will change as a function of power supply current and this change in voltage results in a nonlinear step size.

Figure 6:
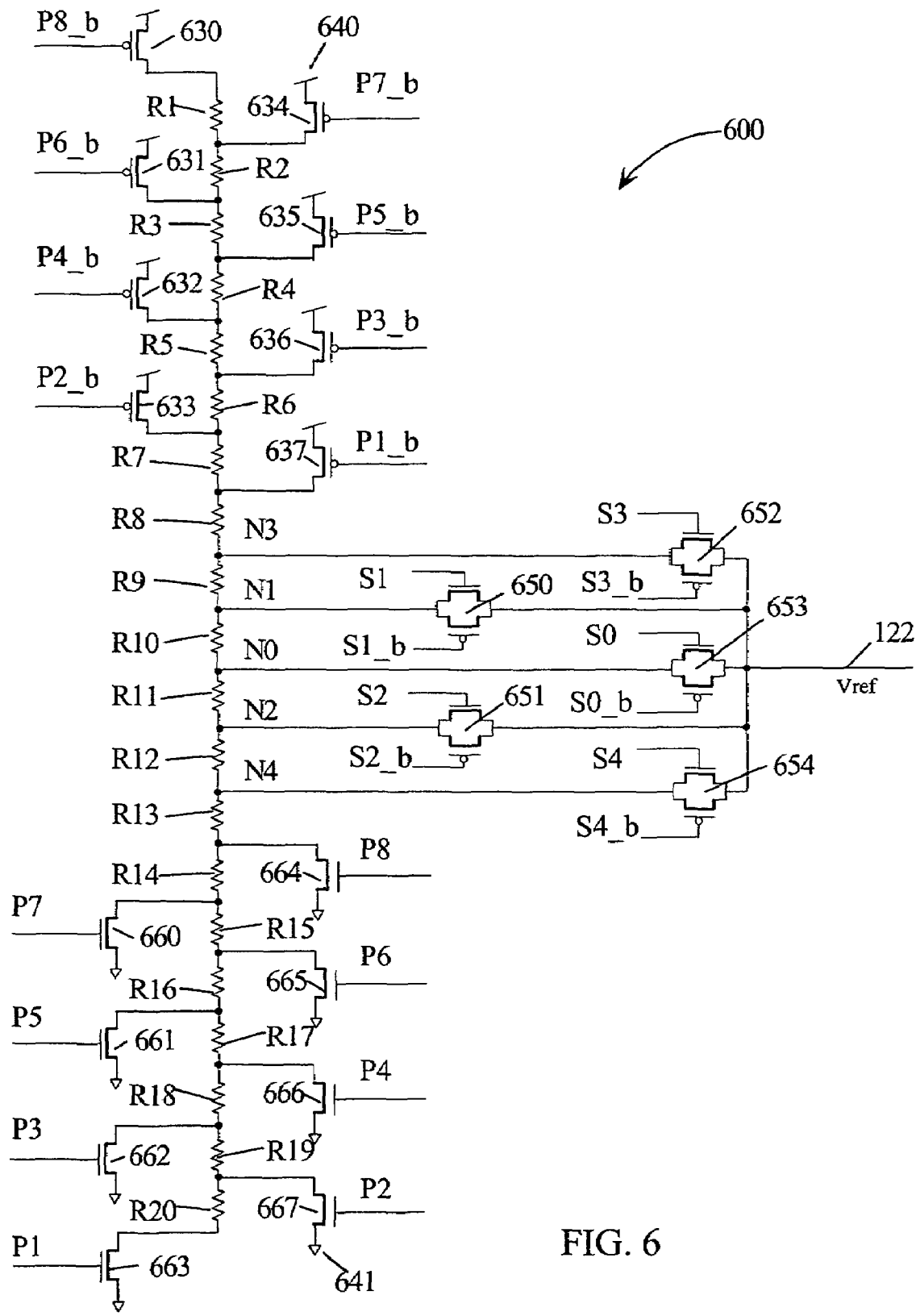
FIG. 6 is a circuit diagram of a reference generator according to another embodiment of the present invention.

FIG. 6 is a circuit diagram of a reference generator 600 for generating a Vref 122 according to embodiments of the present invention. A resistor string R1–R20 is coupled between the positive voltage 640 and the ground voltage 641 of a power supply. Control signals P(M) and P(M)_b (e.g., P1 and P1_b) are complementary pairs and have opposite logic states. As the control signals are selected, resistance is added or subtracted from the top resistors (R1–R7) and an equal resistance is subtracted or added in the bottom resistors (R14–R20). In this manner, the total resistance in the string at any one time remains substantially constant and therefore the current from the power supply remains substantially constant. However, since the resistance in the top resistors R1–R7 relative to the resistance of the bottom resistors R14–R20 changes, the value of Vref 122 is programmed or stepped. Pass gates 650–664 are used to select small increments above or below a nominal value at node N0 in response to complementary control signals S(R)–S(R)_b (e.g., S1 and S1_b). Nodes N1 and N3 have values above the nominal value and nodes N2 and N4 have values below the nominal value. In this embodiment, Vref 122 is a function of resistor ratios and therefore the process variations are minimized and Vref 122 may be varied in small steps sizes that are linear with circuitry that does not take up a large area.

Figure 7:
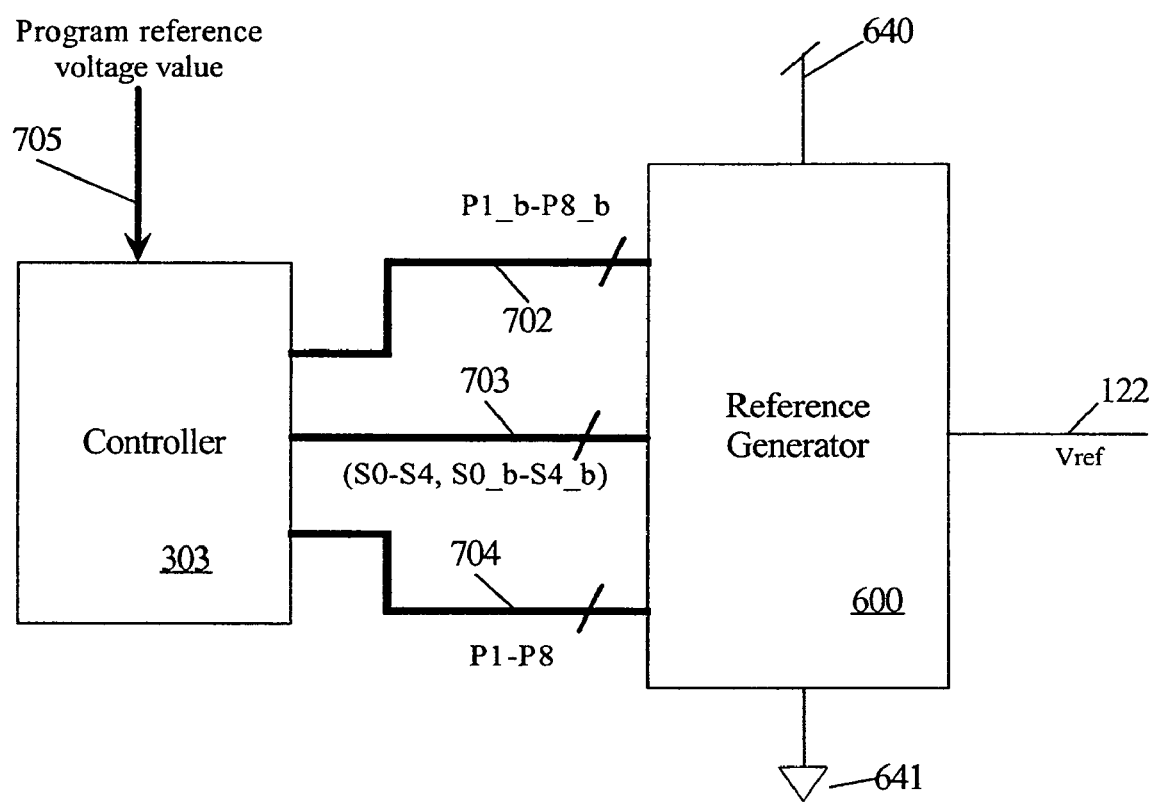
FIG. 7 is a circuit block diagram of a controller used to generate control signals in response to a request for a particular program reference voltage value according to embodiments of the present invention.

FIG. 7 is a circuit block diagram illustrating a controller (e.g., 303) for the reference generator 600 of FIG. 6. A program reference voltage value signal 705 requests a particular value for Vref 122. Controller 303 generates control signals 702–704 to program the reference generator 600 as shown in FIG. 6. Vref 122 is generated by programming reference generator 600 thereby generating reference voltage values that vary from a maximum to a minimum value between voltage potentials 640 and 641 of a power supply (not shown) while keeping the current from the power supply substantially constant according to embodiments of the present invention.

Although the present invention and its advantages have been described in detail, it should be understood that various changes, substitutions and alterations can be made herein without departing from the spirit and scope of the invention as defined by the appended claims.

What is claimed is:

1. A reference generator for generating a programmable reference voltage comprising:
    a series connection of a number N resistors forming N+1 nodes;
    a plurality of first electronic switches each configured to couple a first voltage potential to a selected first node of the N+1 nodes in response to a corresponding one of a plurality of first control signals;
    a plurality of second electronic switches each configured to couple a second voltage potential to a selected second node of the N+1 nodes in response to a corresponding one of a plurality of second control signals; and
    an output coupled to one of the N+1 nodes between the selected first node and the selected second node thereby generating the programmable reference voltage at the output, wherein a resistance between the selected first node and selected second node remains substantially a constant value when the programmable reference voltage at the output is varied in response to the first and second control signals.

2. The reference generator of claim 1, wherein the N resistors are partitioned into P first resistors forming P+1 first nodes node, K second resistors forming K−1 vernier nodes between a node number P+1 and a node number P+K+1, and P first resistors forming P+1 second nodes between the node number P+K+1 and a node number N+1.

3. The reference generator of claim 2, wherein the plurality of first electronic switches comprises P+1 first electronic switches each coupling one the P+1 first nodes to the first voltage potential in response to one of P+1 first control signals from the plurality of first control signals.

4. The reference generator of claim 3, wherein the plurality of second electronic switches comprises P+1 second electron switches each coupling one of the P+1 second nodes to the second voltage potential in response to one of P+1 second control signals from the plurality of second control signals.

5. The reference generator of claim 4 further comprising K−1 third electronic switches each coupling one of the K−1 vernier nodes to the output in response to K−1 third control signals.

6. The reference generator of claim 5, further comprising a controller generating the first, second, and third control signals as one hot control signals in response to a program reference voltage value, wherein one and only one of each of the first, second, and third electronic switches are concurrently gated ON during any one time period generating the programmable reference voltage.

7. The reference generator of claim 2, wherein values of each of the first resistors are equal to ensure equal voltage step sizes when the programmable reference voltage is varied in response to the first and second control signals.

8. The reference generator of claim 1, wherein the plurality of first electronic switches comprise a P-channel field effect transistor (PFET) having a source terminal coupled to the first voltage potential, a gate terminal coupled to one of the first control signals and a drain coupled to the selected first node of the N+1 nodes.

9. The reference generator of claim 1, wherein the plurality of second electronic switches comprise N-channel field effect transistors (NFET) having a source terminal coupled to the second voltage potential, a gate terminal coupled to one of the second control signals and a drain coupled to the selected second node of the N+1 nodes.

10. The reference generator of claim 5, wherein the K−1 third electronic switches each are configured as a pass transistor device each with an input node coupled to one of the K−1 vernier nodes, an output node coupled to the output and a control input node coupled to a corresponding one of the K−1 third control signals.

11. A data processing system comprising:
a central processing unit (CPU);
a random access memory (RAM);
an input output (I/O) interface unit; and
a bus for coupling the CPU, RAM and I/O interface unit, the data processing system having circuitry for pseudo differential signaling including a programmable reference voltage generator having a series connection of a number N resistors forming N+1 nodes, a plurality of first electronic switches each configured to couple a first voltage potential to a selected first node of the N+1 nodes in response to a corresponding one of a plurality of first control signals, a plurality of second electronic switches each configured to couple a second voltage potential to a selected second node of the N+1 nodes in response to a corresponding one of a plurality of second control signals, and an output coupled to one of the N+1 nodes between the selected first node and the selected second node thereby generating the programmable reference voltage at the output, wherein a resistance between the selected first node and selected second node remains substantially a constant value when the programmable reference voltage at the output is varied in response to the first and second control signals.

12. The data processing system of claim 11, wherein the N resistors are partitioned into P first resistors forming P+1 first nodes node, K second resistors forming K−1 vernier nodes between a node number P+1 and a node number P+K+1, and P first resistors forming P+1 second nodes between the node number P+K+1 and a node number N+1.

13. The data processing system of claim 12, wherein the plurality of first electronic switches comprises P+1 first electronic switches each coupling one the P+1 first nodes to the first voltage potential in response to one of P+1 first control signals from the plurality of first control signals.

14. The data processing system of claim 13, wherein the plurality of second electronic switches comprises P+1 second electron switches each coupling one of the P+1 second nodes to the second voltage potential in response to one of P+1 second control signals from the plurality of second control signals.

15. The data processing system of claim 14 further comprising K−1 third electronic switches each coupling one of the K−1 vernier nodes to the output in response to K−1 third control signals.

16. The data processing system of claim 15, further comprising a controller generating the first, second, and third control signals as one hot control signals in response to a program reference voltage value, wherein one and only one of each of the first, second, and third electronic switches are concurrently gated ON during any one time period generating the programmable reference voltage.

17. The data processing system of claim 12, wherein values of each of the first resistors are equal to ensure equal voltage step sizes when the programmable reference voltage is varied in response to the first and second control signals.

18. The data processing system of claim 11, wherein the plurality of first electronic switches comprise a P-channel field effect transistor (PFET) having a source terminal coupled to the first voltage potential, a gate terminal coupled to one of the first control signals and a drain coupled to the selected first node of the N+1 nodes.

19. The data processing system of claim 11, wherein the plurality of second electronic switches comprise N-channel field effect transistors (NFET) having a source terminal coupled to the second voltage potential, a gate terminal coupled to one of the second control signals and a drain coupled to the selected second node of the N+1 nodes.

20. The data processing system of claim 15, wherein the K−1 third electronic switches each are configured as a pass transistor device each with an input node coupled to one of the K−1 vernier nodes, an output node coupled to the output and a control input node coupled to a corresponding one of the K−1 third control signals.

* * * * *